United States Patent
Ueno et al.

(10) Patent No.: US 8,745,569 B2
(45) Date of Patent: Jun. 3, 2014

(54) EQUIVALENT CIRCUIT OF BIDIRECTIONAL SWITCH, SIMULATION METHOD FOR BIDIRECTIONAL SWITCH, AND SIMULATION DEVICE FOR BIDIRECTIONAL SWITCH

(71) Applicant: Panasonic Corporation, Osaka (JP)

(72) Inventors: Hiroaki Ueno, Osaka (JP); Satoshi Makioka, Osaka (JP); Manabu Yanagihara, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/867,187

(22) Filed: Apr. 22, 2013

(65) Prior Publication Data

US 2013/0232462 A1    Sep. 5, 2013

Related U.S. Application Data

(63) Continuation of application No. PCT/JP2012/004011, filed on Jun. 20, 2012.

(30) Foreign Application Priority Data

Jun. 23, 2011 (JP) .................................. 2011-139077

(51) Int. Cl.
     *G06F 17/50* (2006.01)
(52) U.S. Cl.
     USPC .......................................... 716/136; 716/107
(58) Field of Classification Search
     USPC ......................................... 716/100–105, 136
     See application file for complete search history.

(56) References Cited

U.S. PATENT DOCUMENTS

| | | | |
|---|---|---|---|
| 8,099,707 B1 * | 1/2012 | Li | ................................. 716/139 |
| 8,203,376 B2 | 6/2012 | Morita et al. | |
| 2004/0056341 A1 * | 3/2004 | Endo et al. | .................... 257/678 |
| 2006/0151816 A1 * | 7/2006 | Asano et al. | .................. 257/275 |
| 2010/0097105 A1 | 4/2010 | Morita et al. | |

FOREIGN PATENT DOCUMENTS

| | | |
|---|---|---|
| JP | 2699844 | 1/1998 |
| JP | 2005-101254 | 4/2005 |
| JP | 3649828 | 5/2005 |
| JP | 2005-268417 | 9/2005 |
| JP | 2009-123914 | 6/2009 |
| JP | 2010-002202 | 1/2010 |
| JP | 2010-004588 | 1/2010 |
| JP | 2011-114213 | 6/2011 |
| WO | 2008/062800 | 5/2008 |
| WO | 2009/153965 | 12/2009 |

OTHER PUBLICATIONS

International Search Report issued Sep. 18, 2012 in International (PCT) Application No. PCT/JP2012/004011.

* cited by examiner

*Primary Examiner* — Binh Tat

(74) *Attorney, Agent, or Firm* — Wenderoth, Lind & Ponack, LLP.

(57) ABSTRACT

Provided is a simulation method for simulating electrical properties of a bidirectional switch formed as a single element and having a double gate structure. A simulation is performed using an equivalent circuit having a symmetrical structure in which a drain electrode of a JFET and a drain electrode of another JFET are connected via a resistor.

9 Claims, 18 Drawing Sheets

FIG. 11

```
C3 N001 0 C
C4 N002 N005 C
J1 N004 N006 P001 JFET
J2 N004 N003 P002 JFET
V1 N005 N007 0 Rser=0 Cpar=0
V2 N001 N007 0 Rser=0 Cpar=0
I1 N001 N002 10m
R3 N006 N005 R
R4 N003 N002 R
R1 P001 P003 R
R2 P004 P002 R
L1 P003 0 L
L2 N001 P004 L
C1 N005 0 C
C2 N001 N002 C
.dc V2 0 10 0.2 V1 0 4 1
.backanno
.end
```

FIG. 16

```
C3 N001 0 C
C4 N002 N005 C
J1 N004 N006 P001 HFET
J2 N004 N003 P002 HFET
V1 N005 N007 0 Rser=0 Cpar=0
V2 N001 N007 0 Rser=0 Cpar=0
I1 N001 N002 10m
R3 N006 N005 R
R4 N003 N002 R
R1 P001 P003 R
R2 P004 P002 R
L1 P003 0 L
L2 N001 P004 L
C1 N005 0 C
C2 N001 N002 C
.dc V2 0 10 0.2 V1 0 41
.backanno
.end
```

FIG. 19

```
C3 N001 0 C
C4 N002 N005 C
J1 N004 N006 P001 MOSFET
J2 N004 N003 P002 MOSFET
V1 N005 N007 0 Rser=0 Cpar=0
V2 N001 N007 0 Rser=0 Cpar=0
I1 N001 N002 10m
R3 N006 N005 R
R4 N003 N002 R
R1 P001 P003 R
R2 P004 P002 R
L1 P003 0 L
L2 N001 P004 L
C1 N005 0 C
C2 N001 N002 C
.dc V2 0 10 0.2 V1 0 4 1
.backanno
.end
```

EQUIVALENT CIRCUIT OF BIDIRECTIONAL SWITCH, SIMULATION METHOD FOR BIDIRECTIONAL SWITCH, AND SIMULATION DEVICE FOR BIDIRECTIONAL SWITCH

CROSS REFERENCE TO RELATED APPLICATIONS

This is a continuation application of PCT International Application No. PCT/JP2012/004011 filed on Jun. 20, 2012, designating the United States of America, which is based on and claims priority of Japanese Patent Application No. 2011-139077 filed on Jun. 23, 2011. The entire disclosures of the above-identified applications, including the specifications, drawings and claims are incorporated herein by reference in their entirety.

FIELD

One or more exemplary embodiments disclosed herein relate generally to a simulation method for simulating electrical properties of a bidirectional switch, and in particular to a simulation method performed using an equivalent circuit of a bidirectional switch formed as a single element.

BACKGROUND

A bidirectional switch used in a power electronic circuit is an element which, under a first bias condition, allows a current to flow only in one direction and blocks a current in an opposite direction. Under a second bias condition different from the first bias condition, the above bidirectional switch blocks a current flow in the direction in which a current is allowed to flow under the first bias condition, and allows a current to flow in the direction in which a current flow is blocked under the first bias condition.

In addition, the above bidirectional switch has a configuration in which plural discrete devices (discrete semiconductors) are used, and in recent years, research is being conducted on a bidirectional switch formed as a single element and having a double gate structure (for example, see Patent Literature (PTL) 1). A decrease in the size of a device in which a bidirectional switch is used can be expected by forming a bidirectional switch as a single element, namely, one discrete device.

CITATION LIST

Patent Literature

[PTL 1] International Patent Application Publication No. 2008/062800

SUMMARY

Technical Problem

It is necessary to design a circuit to use a new bidirectional switch formed as a single element. However, a simulation method performed using an equivalent circuit used for, for example, a conventional bidirectional switch illustrated in FIG. 1 is inapplicable to a new bidirectional switch formed as a single element. This is because different simulation methods performed using equivalent circuits are used for devices such as bidirectional switches.

In view of this, one non-limiting and exemplary embodiment provides a simulation method with high precision performed using an equivalent circuit, for a bidirectional switch formed as a single element.

Solution to Problem

In one general aspect, the techniques disclosed here feature an equivalent circuit of a bidirectional switch which is formed as a single element, includes: a first source electrode; a second source electrode; a first gate electrode; and a second gate electrode, and controls, using a voltage applied to the first gate electrode and the second gate electrode, a current flowing between the first source electrode and the second source electrode, the equivalent circuit including: a first field effect transistor having a first gate, a first electrode, and a second electrode; a first resistor and a first inductor connected in series, and having a terminal electrically connected to the first electrode and another terminal electrically connected to a first input/output electrode corresponding to the first source electrode; a third resistor having a terminal electrically connected to the first gate and another terminal electrically connected to a first control electrode corresponding to the first gate electrode; a first capacitor having a terminal electrically connected to the first input/output electrode and another terminal electrically connected to the first control electrode; a second field effect transistor having a second gate, a third electrode, and a fourth electrode; a second resistor and a second inductor connected in series, and having a terminal electrically connected to the third electrode and another terminal electrically connected to a second input/output electrode corresponding to the second source electrode; a fourth resistor having a terminal electrically connected to the second gate and another terminal electrically connected to the second control electrode corresponding to the second gate electrode; a second capacitor having a terminal electrically connected to the second input/output electrode and another terminal electrically connected to the second control electrode; a third capacitor having a terminal electrically connected to the first control electrode and another terminal electrically connected to the second control electrode; a fourth capacitor having a terminal electrically connected to the first input/output electrode and another terminal electrically connected to the second input/output electrode; and a fifth resistor having a terminal electrically connected to the second electrode and another terminal electrically connected to the fourth electrode.

It should be noted that these general and specific aspects may be implemented using a system, a method, an integrated circuit, a computer program, or a computer-readable recording medium such as a CD-ROM, or any combination of systems, methods, integrated circuits, computer programs or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to an equivalent circuit of a bidirectional switch according to one or more exemplary embodiments or features disclosed herein, it is possible to simulate, with high precision, electrical properties of a bidirectional switch formed as a single element.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 11 illustrates an example of a netlist of the equivalent circuit of the bidirectional switch according to Embodiment 1.

FIG. 16 illustrates an example of a netlist of an equivalent circuit of the bidirectional switch according to Embodiment 2.

FIG. 19 illustrates an example of a netlist of an equivalent circuit of the bidirectional switch according to Embodiment 3.

DESCRIPTION OF EMBODIMENTS (Underlying Knowledge Forming Basis of the Present Disclosure)

As described in the Background section, a bidirectional switch used for a power electronic circuit has been known.

Figure 1:
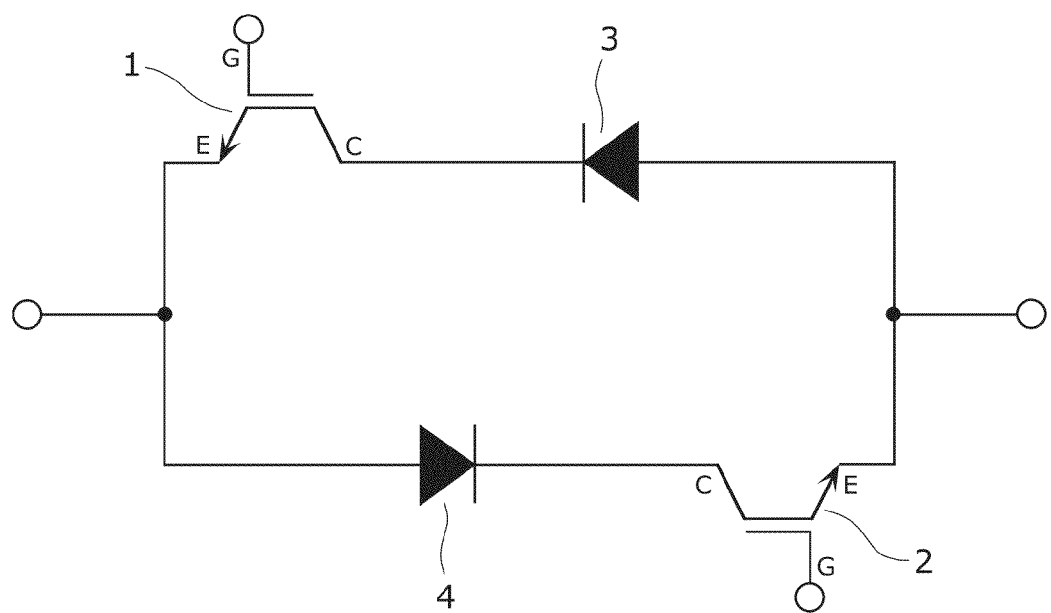
FIG. 1 is a circuit diagram of a conventional bidirectional switch in which IGBTs and diodes are used.

FIG. 1 illustrates a conventional bidirectional switch for a power electronic circuit. The bidirectional switch illustrated in FIG. 1 has two sets each including an insulated gate bipolar transistor (IGBT) for which one type of silicon is used and a diode for which one type of silicon is used.

Figure 2:
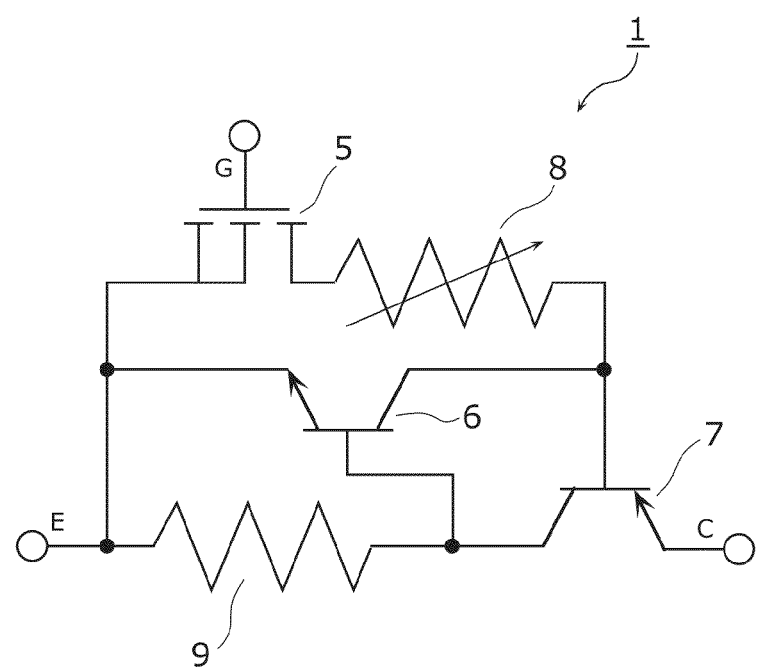
FIG. 2 is an equivalent circuit diagram of a general IGBT.

FIG. 2 illustrates an equivalent circuit model of an ordinary IGBT. The equivalent circuit model illustrated in FIG. 2 has one metal-oxide-semiconductor field effect transistor (MOSFET) and two bipolar junction transistors (BJTs) in the IGBT. In other words, two BJTs are present, which makes the configuration complicated. As shown in FIG. 1, four discrete devices (discrete semiconductors) are necessary in order to form a general bidirectional switch. A diode is not necessary if a bidirectional switch is formed using a reverse blocking IGBT, and thus a bidirectional switch can be formed using two discrete devices (discrete semiconductors). However, both the above cases require plural discrete devices, which is disadvantageous to decrease the size of the bidirectional switch.

In view of this, research is being conducted on a use of a power switch formed as a single element and having a double gate structure, for a bidirectional switch of a power electronic circuit (for example, see PTL 1). A decrease of a bidirectional switch in size can be expected by forming a bidirectional switch as a single element, or specifically, a discrete device.

In view of this, an equivalent circuit of a bidirectional switch according to an aspect of the present disclosure is an equivalent circuit of a bidirectional switch which is formed as a single element, includes: a first source electrode; a second source electrode; a first gate electrode; and a second gate electrode, and controls, using a voltage applied to the first gate electrode and the second gate electrode, a current flowing between the first source electrode and the second source electrode, the equivalent circuit including: a first field effect transistor having a first gate, a first electrode, and a second electrode; a first resistor and a first inductor connected in series, and having a terminal electrically connected to the first electrode and another terminal electrically connected to a first input/output electrode corresponding to the first source electrode; a third resistor having a terminal electrically connected to the first gate and another terminal electrically connected to a first control electrode corresponding to the first gate electrode; a first capacitor having a terminal electrically connected to the first input/output electrode and another terminal electrically connected to the first control electrode; a second field effect transistor having a second gate, a third electrode, and a fourth electrode; a second resistor and a second inductor connected in series, and having a terminal electrically connected to the third electrode and another terminal electrically connected to a second input/output electrode corresponding to the second source electrode; a fourth resistor having a terminal electrically connected to the second gate and another terminal electrically connected to the second control electrode corresponding to the second gate electrode; a second capacitor having a terminal electrically connected to the second input/output electrode and another terminal electrically connected to the second control electrode; a third capacitor having a terminal electrically connected to the first control electrode and another terminal electrically connected to the second control electrode; a fourth capacitor having a terminal electrically connected to the first input/output electrode and another terminal electrically connected to the second input/output electrode; and a fifth resistor having a terminal electrically connected to the second electrode and another terminal electrically connected to the fourth electrode.

This enables a high precision simulation of electrical properties of a device in which a bidirectional switch formed as a single element is used, as well as a peripheral circuit, the simulation being performed using an equivalent circuit. Thus, development of a device in which a bidirectional switch is used is facilitated. Specifically, a time and cost for the development can be greatly decreased.

In addition, according to an aspect of the present disclosure, the first field effect transistor and the second field effect transistor may be junction field effect transistors.

In this way, using a junction field effect transistor allows the electrical properties of a bidirectional switch which includes a group III nitride semiconductor to be simulated with high precision.

In addition, according to an aspect of the present disclosure, the first field effect transistor and the second field effect transistor may be hetero-junction field effect transistors.

In this way, using a hetero-junction field effect transistor allows the electrical properties of a bidirectional switch which includes a II-VI group compound semiconductor to be simulated with high precision.

In addition, according to an aspect of the present disclosure, the first field effect transistor and the second field effect transistor may be metal-oxide-semiconductor field effect transistors.

In this way, using a metal-oxide-semiconductor field effect transistor allows the electrical properties of a bidirectional switch which includes silicon to be simulated with high precision.

In addition, a simulation method according to an aspect of the present disclosure may be a simulation method for a bidirectional switch performed using the equivalent circuit according to the aspect of the present disclosure, the simulation method including: accepting input of voltage values of voltages to be applied to the first control electrode, the second control electrode, the first input/output electrode, and the second input/output electrode; and calculating an electrical property of the bidirectional switch, based on the equivalent circuit and the voltage values.

In addition, according to an aspect of the present disclosure, in the calculation, a current value of a current may be calculated, the current flowing between the first input/output electrode and the second input/output electrode when the first control electrode and the first input/output electrode have short-circuited and a voltage is applied across the second control electrode and the second input/output electrode, and a current value of a current may be calculated, the current flowing between the first input/output electrode and the second input/output electrode when the second control electrode and the second input/output electrode have short-circuited and a voltage is applied across the first control electrode and the first input/output electrode.

In addition, according to an aspect of the present disclosure, the simulation method may further include determining a circuit constant of a resistance value of the fifth resistor of the bidirectional switch, wherein in the determination, a first resistance value may be calculated using a voltage and a current, the voltage being applied across the first gate electrode and the first source electrode and the current flowing between the first gate electrode and the first source electrode in a state where the first gate electrode and the second source electrode are open, a second resistance value may be calculated using a voltage and a current, the voltage being applied across the second gate electrode and the first source electrode and the current flowing between the second gate electrode and the first source electrode in a state where the second gate electrode and the second source electrode are open, and a difference between the first resistance value and the second resistance value may be determined to be the resistance value of the fifth resistor.

In addition, a simulation device according to an aspect of the present disclosure may include a storage unit configured to store therein the equivalent circuit according to one of the above aspects of the present disclosure as circuit information; an input unit configured to accept input of voltage values of voltages to be applied to the first control electrode, the second control electrode, the first input/output electrode, and the second input/output electrode; and a calculation unit configured to calculate an electrical property of the bidirectional switch, based on the circuit information and the voltage values.

In addition, as an exemplary embodiment, techniques disclosed herein may be achieved as a recording medium having stored therein the equivalent circuit of the bidirectional switch according to one of the above aspects of the present disclosure, as circuit information.

It should be noted that as an exemplary embodiment, techniques disclosed herein may be achieved as a server device which provides circuit information of the equivalent circuit of the bidirectional switch according to one of the above aspects of the present disclosure.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

The following is a description of exemplary embodiments, with reference to the accompanying Drawings.

Each of the exemplary embodiments described below shows a general or specific example. The numerical values, constituent elements, the arrangement and connection of the constituent elements, steps, the processing order of the steps and the like shown in the following exemplary embodiments are mere examples, and therefore do not limit the scope of the appended Claims and their equivalents. Thus, among the constituent elements in the following exemplary embodiments, constituent elements not recited in any of the independent claims defining the most generic part of the inventive concept are described as arbitrary constituent elements.

Embodiment 1

The following is a description of Embodiment 1, with reference to the drawings.

(Configuration of Bidirectional Switch)

Figure 3:
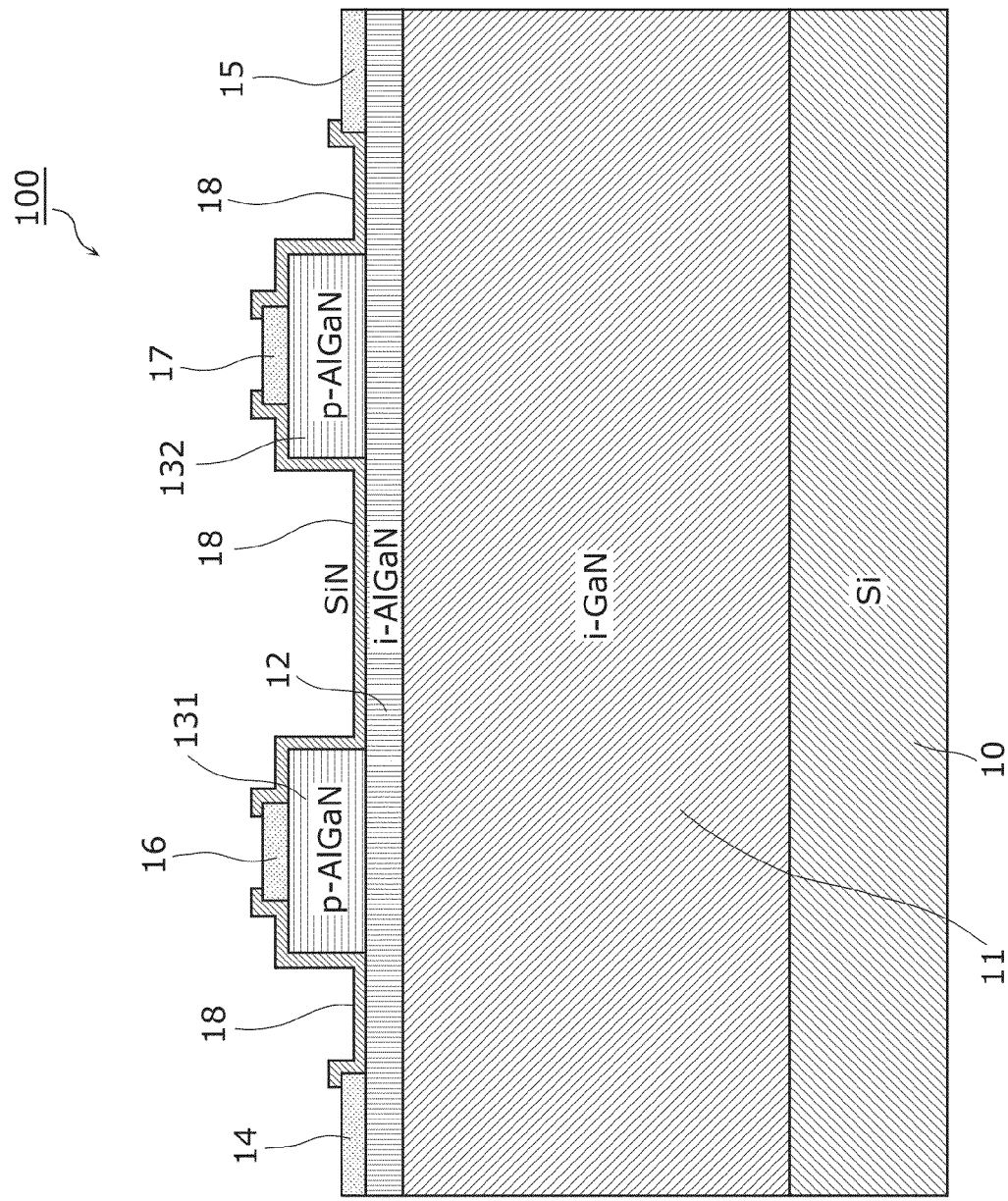
FIG. 3 illustrates an example of an element structure of a bidirectional switch according to Embodiment 1.

In Embodiment 1, a description is given of an equivalent circuit of a bidirectional switch 100, and a simulation method performed using this equivalent circuit. FIG. 3 illustrates a cross-sectional configuration of the bidirectional switch for which simulation is performed.

A first group III nitride semiconductor layer 11 is formed on a substrate 10. The material of the substrate 10 is silicon (Si), for example. The material of the first group III nitride semiconductor layer 11 is i-GaN, for example.

A second group III nitride semiconductor layer 12 is formed on the first group III nitride semiconductor layer 11. The material of the second group III nitride semiconductor layer 12 is a material having a larger band gap than that of the material of the first group III nitride semiconductor layer 11. The material of the second group III nitride semiconductor layer 12 is i-AlGaN, for example.

On the second group III nitride semiconductor layer 12, a first source electrode 14, a second source electrode 15, a first control layer 131, and a second control layer 132 are formed so as to be separate from one another.

The material of the first source electrode 14 and the second source electrode 15 is an alloy of gold and titanium, for example. The material of the first control layer 131 and the second control layer 132 is a group III nitride semiconductor having p-type conductivity. The material of the first control layer 131 and the second control layer 132 is p-AlGaN, for example.

A first gate electrode 16 is formed on the first control layer 131. A second gate electrode 17 is formed on the second control layer 132. The material of the first gate electrode 16 and the second gate electrode 17 is an alloy of gold and titanium, for example.

A protective film 18 is formed so as to cover the second group III nitride semiconductor layer 12, the first control layer 131, and the second control layer 132. The material of the protective film 18 is SiN, for example.

A detailed description is given of the bidirectional switch illustrated in FIG. 3. Group III nitride semiconductors can make a hetero-junction. However, carriers of high concentration are generated on the hetero-junction interface between the group III nitride semiconductors due to spontaneous polarization and piezo polarization which the group III nitride semiconductors and the hetero-junction structure thereof normally have. Accordingly, if a field effect transistor is produced using group III nitride semiconductors, the transistor tends to be a depletion type (normally-on) field effect transistor, and thus it is difficult to obtain characteristics of an enhancement type (normally-off) field effect transistor. Most devices currently used in the power electronics field are normally-off devices.

There is a normally-off semiconductor device having excellent peak reverse voltage characteristics and including a group III nitride semiconductor, the device having a configuration in which two layers each called a control layer and having p-type conductivity are provided between two ohmic electrodes (for example, see PTL 1).

Specifically, the above semiconductor device (bidirectional switch 100) includes: the first group III nitride semiconductor layer 11 formed on the substrate 10; the second group III nitride semiconductor layer 12 formed on the first group III nitride semiconductor layer 11, and having a larger band gap than that of the first group III nitride semiconductor layer 11; the first control layer 131 and the second control layer 132 formed on the second group III nitride semiconductor layer 12 in a direction parallel to the main surface of the substrate so as to be separate from each other, and each including a group III nitride semiconductor having p-type conductivity (p-AlGaN); the first source electrode 14 formed on the second group III nitride semiconductor layer 12, in an area on a side of the first control layer 131, the area being located opposite to the second control layer 132; and the second source electrode 15 formed on the second group III nitride semiconductor layer 12, in an area on a side of the second control layer 132, the area being opposite to the first control layer 131, wherein the entire surface except for the surfaces of the gates and the source electrodes is covered with the protective film 18 (SiN).

This semiconductor device includes the first control layer 131 and the second control layer 132 formed on the second group III nitride semiconductor layer 12 in a horizontal direction so as to be separate from each other, and each including a group III nitride semiconductor having p-type conductivity, and thus electrical conductivity between the two source electrodes can be controlled by a bias applied to the first gate electrode 16 and the second gate electrode 17.

Accordingly, irrespective of the bias applied to the first gate electrode 16, when the potential of at least the second source electrode 15 is lower than the potential of the first source electrode 14, a potential lower than the potential of the second source electrode 15 is applied to the second gate electrode 17, thereby changing the state of a channel region below the second control layer 132 to a pinch-off state. As a result, it is possible to obtain a semiconductor device having excellent peak reverse voltage characteristics which a conventional group III nitride semiconductor device cannot have. The application of this device achieves a bidirectional switch which is formed as a single element and is smaller than a conventional one.

Here, with regard to such a bidirectional switch 100, the inventors of this application achieved the configuration of an equivalent circuit of a bidirectional switch illustrated in FIG. 4 (hereinafter, also simply referred to as equivalent circuit 1000), as a result of energetic research.

Figure 4:
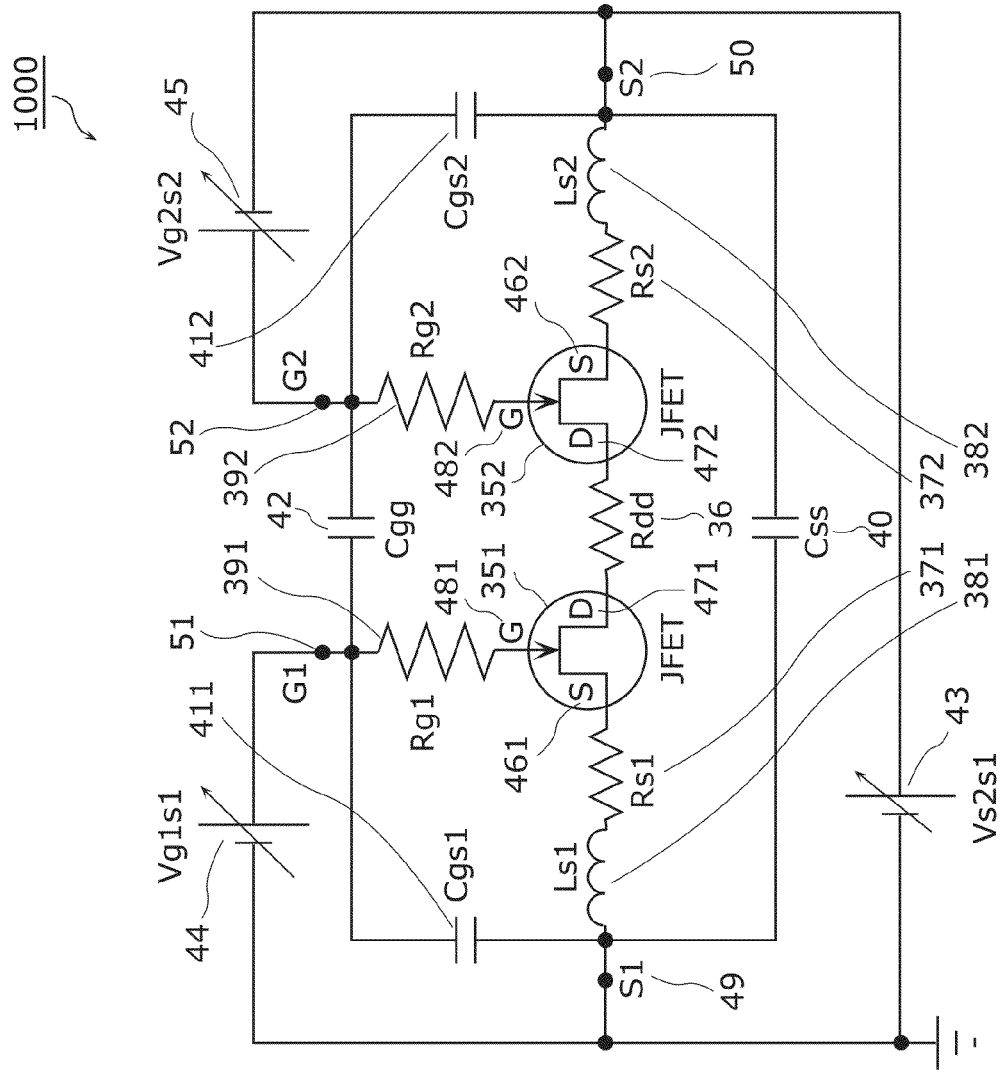
FIG. 4 is an equivalent circuit diagram of a bidirectional switch according to Embodiment 1.

FIG. 4 illustrates an equivalent circuit 1000 of the bidirectional switch 100 illustrated in FIG. 3.

The equivalent circuit 1000 illustrated in FIG. 4 has a symmetrical structure, which is a feature, the structure having drain electrodes of two junction field effect transistors (JFETs) connected via a resistor.

In the equivalent circuit 1000 illustrated in FIG. 4, a resistor 36 (fifth resistor) is connected between a drain electrode 471 (second electrode) of a JFET 351 (first field effect transistor) and a drain electrode 472 of a JFET 352 (second field effect transistor).

A source resistor 371 (first resistor) is connected to a source electrode 461 (first electrode) of the JFET 351, and a source resistor 372 (second resistor) is connected to a source electrode 462 (second electrode) of the JFET 352.

A source inductor 381 (first inductor) is connected in series to the outer terminal (terminal not connected to the source electrode 461) of the source resistor 371, and a source inductor 382 (second inductor) is connected in series to the source resistor 372. The terminal of the source inductor 381 not connected to the source resistor 371 is connected to a first input/output electrode 49, and the terminal of the source inductor 382 not connected to the source resistor 372 is connected to a second input/output electrode 50.

A gate resistor 391 (third resistor) is connected in series to a gate electrode 481 (first gate) of the JFET 351, and a gate resistor 392 (fourth resistor) is connected in series to a gate electrode 482 (second gate) of the JFET 352. The terminal of the gate resistor 391 not connected to the gate electrode 481 is connected to the first control electrode 51, and the terminal of the gate resistor 392 not connected to the gate electrode 482 is connected to a second control electrode 52.

A source-to-source capacitor 40 (fourth capacitor) is connected between the first input/output electrode 49 and the second input/output electrode 50.

A gate-to-source capacitor 411 (first capacitor) is connected between the first input/output electrode 49 and the first control electrode 51, and a gate-to-source capacitor 412 (second capacitor) is connected between the second input/output electrode 50 and the second control electrode 52.

A gate-to-gate capacitor 42 (third capacitor) is connected between the first control electrode 51 and the second control electrode 52.

It should be noted that in the drawings, the source resistor 371 is also denoted by Rs1, and the source resistor 372 is also denoted by Rs2. The gate resistor 391 is also denoted by Rg1, and the gate resistor 392 is also denoted by Rg2. The resistor 36 is also denoted by Rdd.

Similarly, in the drawings, the source inductor 381 is also denoted by Ls1, the source inductor 382 is also denoted by Ls2, the gate-to-source capacitor 411 is also denoted by Cgs1, the gate-to-source capacitor 412 is also denoted by Cgs2, and the source-to-source capacitor 40 is also denoted by Css.

The first input/output electrode 49 is also denoted by S1 in the drawings, and corresponds to the first source electrode 14 of the bidirectional switch 100 illustrated in FIG. 3.

The second input/output electrode 50 is also denoted by S2 in the drawings, and corresponds to the second source electrode 15 of the bidirectional switch 100 illustrated in FIG. 3.

The first control electrode 51 is also denoted by G1 in the drawings, and corresponds to the first gate electrode 16 of the bidirectional switch 100 illustrated in FIG. 3.

The second control electrode 52 is also denoted by G2 in the drawings, and corresponds to the second gate electrode 17 of the bidirectional switch 100 illustrated in FIG. 3.

In the example shown in FIG. 4, a voltage is applied by the first power supply 44 (Vg1s1) across the first input/output electrode 49 and the first control electrode 51, and a voltage is applied by the second power supply 45 (Vg2s2) across the second input/output electrode 50 and the second control electrode 52. Similarly, a voltage is applied from the third power supply 43 (Vs1s2) across the first input/output electrode 49 and the second input/output electrode 50.

The first feature of this equivalent circuit is that the double gate structure of the bidirectional switch 100 is expressed by the two JFETs 351 and 352 connected in series. The second feature is that the resistor 36 is disposed between the two JFETs 351 and 352 connected in series.

First, a description is given of the first feature using an example. The equivalent circuit 1000 in FIG. 4 is an equivalent circuit of the bidirectional switch 100 in FIG. 3, and thus needs to reproduce reverse blocking operation.

Figure 5A:
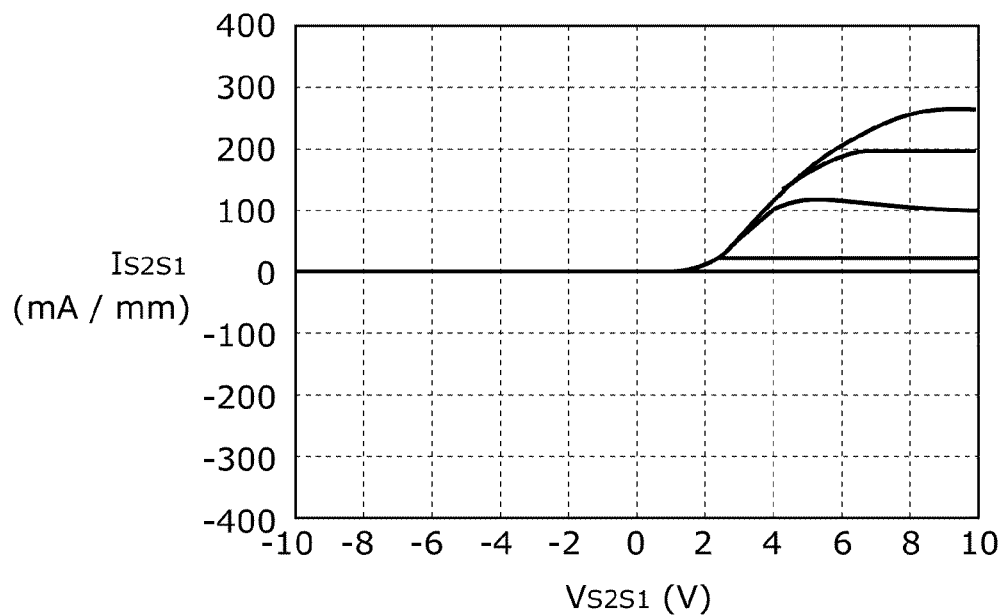
FIG. 5A illustrates data measured when a bidirectional switch performs reverse blocking operation.
Figure 5B:
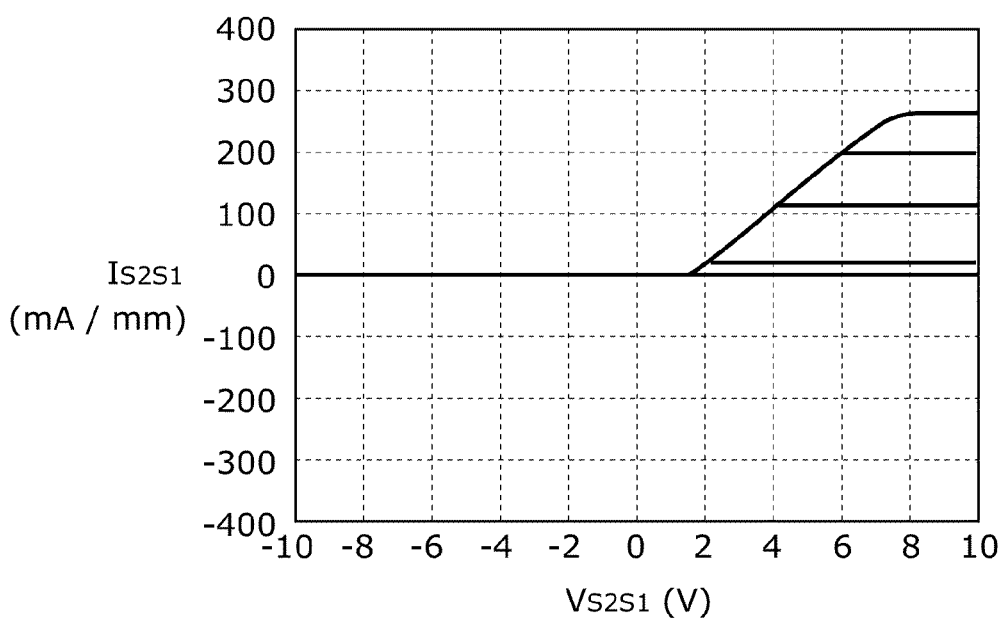
FIG. 5B illustrates simulation data obtained using an equivalent circuit in the case where a bidirectional switch performs reverse blocking operation.

FIGS. 5A and 5B illustrate results of simulation obtained using the equivalent circuit 1000 in FIG. 4, for when the bidirectional switch performs a reverse blocking operation. FIG. 5A shows electrical properties measured in the bidirectional switch 100 in FIG. 3, and FIG. 5B shows electrical properties obtained when a simulation is conducted using the equivalent circuit 1000 in FIG. 4. FIGS. 5A and 5B show that the reverse blocking operation can be simulated using the equivalent circuit 1000.

For example, in the equivalent circuit 1000 in FIG. 4, if the second input/output electrode 50 and the second control electrode 52 have short-circuited, the channel of the JFET 352 does not open unless the potential of the second input/output electrode 50 becomes higher than the potential of the first input/output electrode 49 by a threshold voltage of the JFET 351. Accordingly, a reverse blocking operation can be represented using the equivalent circuit 1000. It should be noted that the same also applies to the case where the first input/output electrode 49 and the first control electrode 51 have short-circuited.

Next, a description is given of the second feature using an example. Normally, channel resistance of a field effect transistor is divided into the following three: (1) resistance directly under a gate electrode; (2) resistance from the source terminal of the gate electrode to a source electrode; and (3) resistance from the drain terminal of the gate electrode to a drain electrode. In the model for circuit simulation, the resistance (1) is represented as "on resistance" of the field effect transistor. The rest of the resistance, namely, the resistance (2) and (3) is represented by adding a resistor as an external resistor, other than the electrode of the field effect transistor.

Here, the bidirectional switch 100 which is to be reproduced using the equivalent circuit 1000 includes two gate electrodes with a certain amount of distance therebetween, in order to increase the peak voltage of the device. Accordingly, the resistance between these two gate electrodes has a magnitude which cannot be ignored. In view of this, the second feature is that the resistor 36 having a resistance corresponding to the resistance between the above gate electrodes is interposed in the equivalent circuit 1000. Accordingly, as described using FIG. 5, it has been confirmed that an actual measurement can be reproduced with extremely high precision.

Figure 6A:
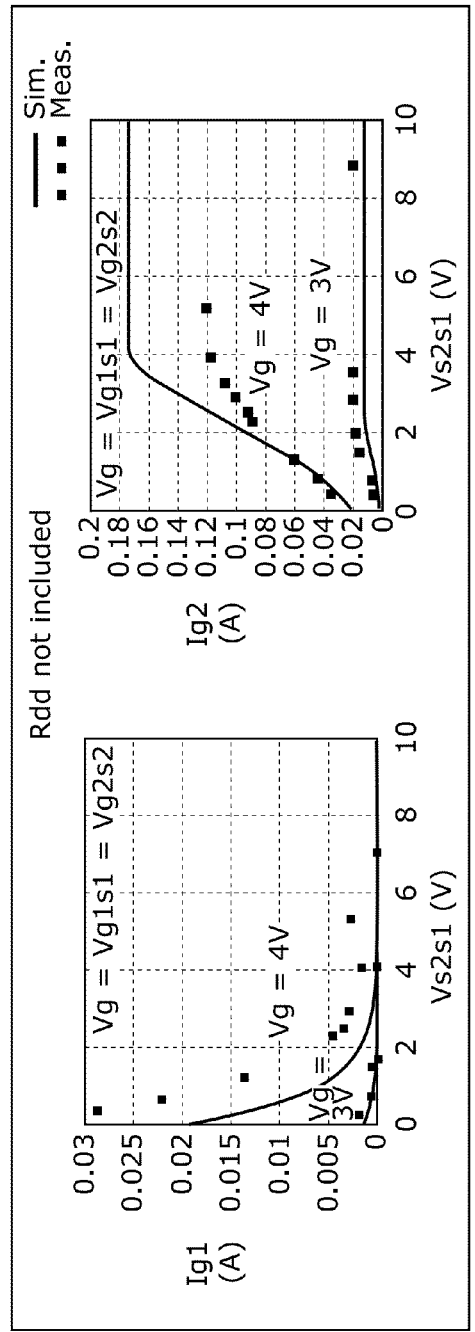
FIGS. 6A and 6B illustrate comparison of differences in precision of simulations depending on whether a resistor disposed between drains is included in an equivalent circuit.
Figure 6B:
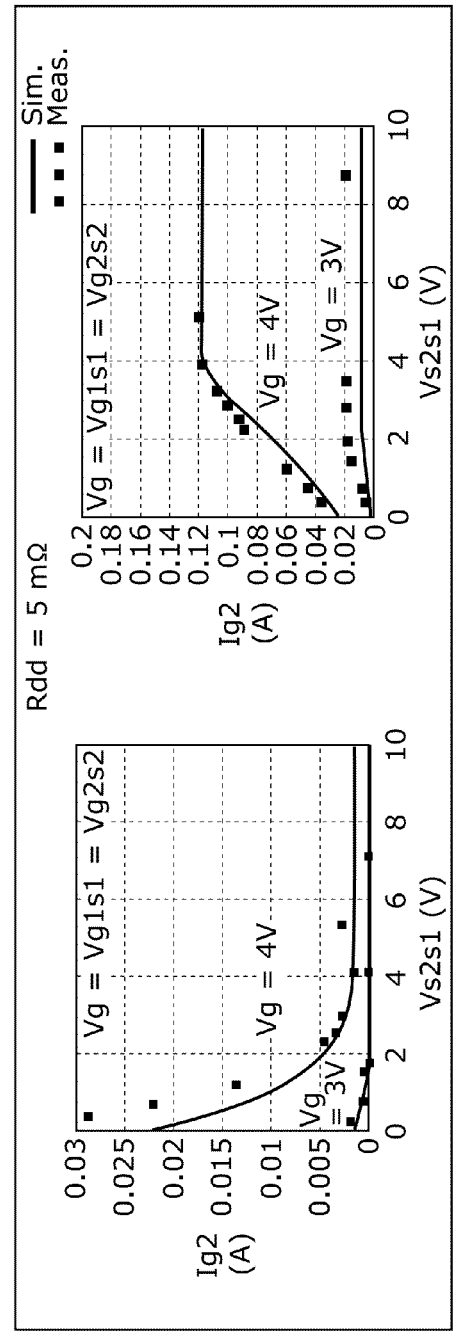

FIGS. 6A and 6B illustrate comparison of differences in the precision of simulations depending on whether the resistor 36 is included. In FIGS. 6A and 6B, the solid lines show simulation values and the square marks in the drawing show measured values. FIG. 6A shows a simulation result obtained when the resistor 36 is not included, and does not reproduce the measured values with precision. However, in FIG. 6B in which the resistor 36 is interposed, it can be seen that the measured values can be reproduced with higher precision.

As described above, whether the resistor 36 is included gives a great influence on the results of simulations using the equivalent circuit 1000. Thus, simulation results with higher precision can be obtained according to the setting of a resistance value of the resistor 36. Although the value of the resistor 36 may be obtained by what is called a cut-and-try method, it is assumed that simulation results with high precision can be obtained by measuring a resistance value at a portion corresponding to the resistor 36 (hereinafter, referred to as a drain-to-drain resistor or Rdd) in the bidirectional switch 100.

However, the portion corresponding to the resistor 36 is in the bidirectional switch 100, and thus measuring the resistance is normally impossible. In view of this, the inventors of the present application accomplished a method for measuring a drain-to-drain resistance, as a result of energetic research.

Figure 7:
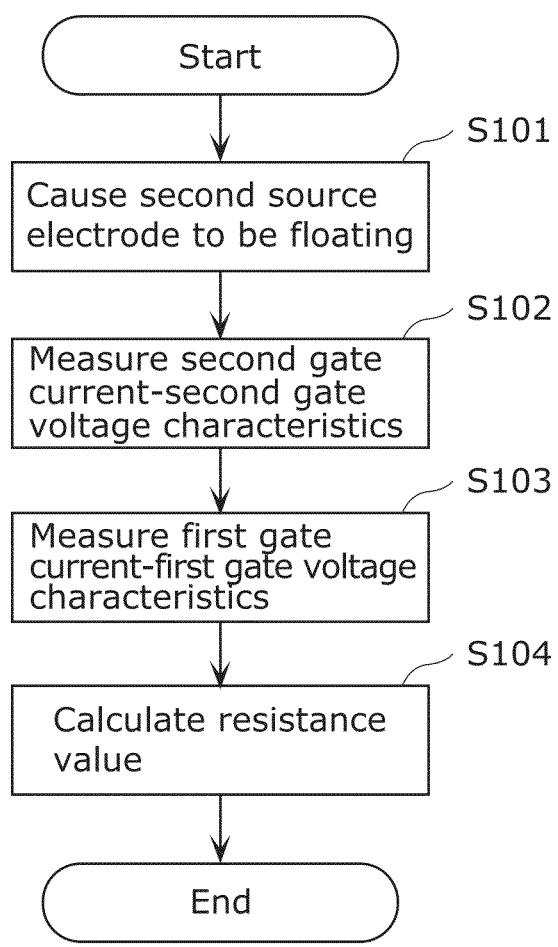
FIG. 7 is a flowchart of a method of measuring a resistance value of a resistor between drains of a bidirectional switch.
Figure 8:
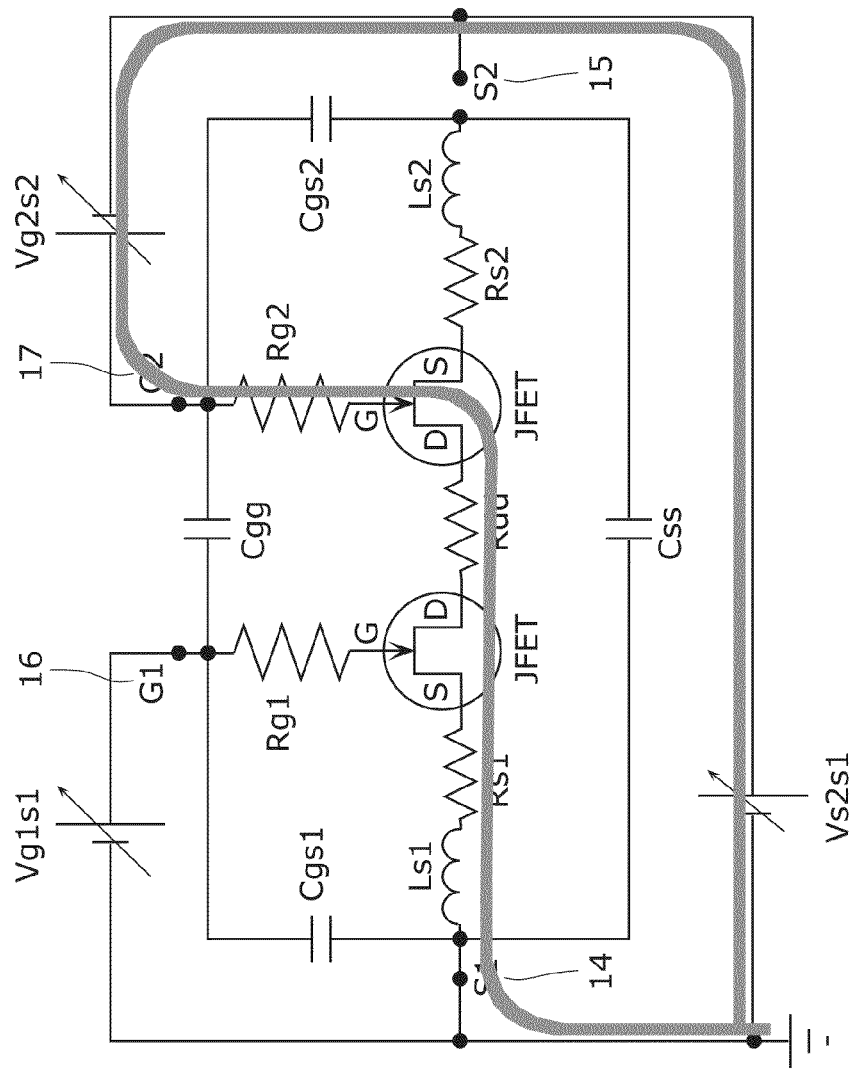
FIG. 8 is a first equivalent circuit diagram illustrating a method of measuring a resistance between drains of a bidirectional switch.
Figure 9:
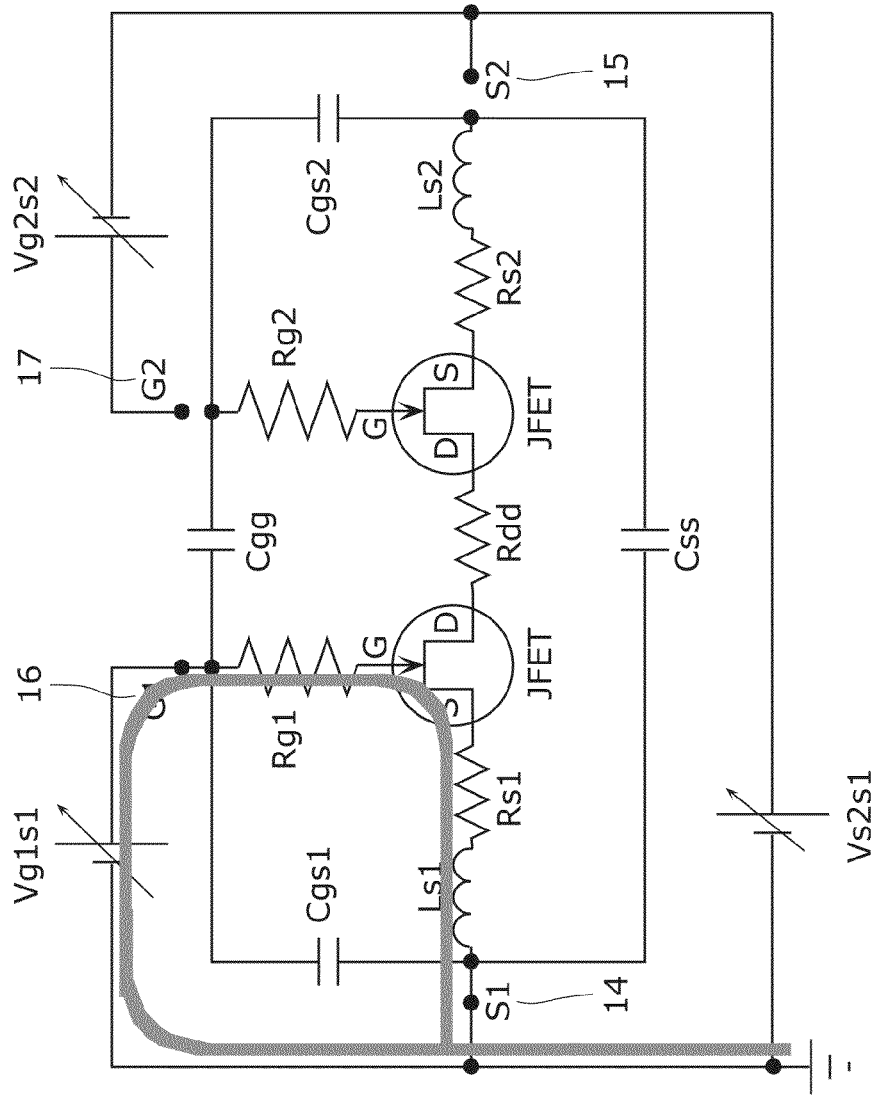
FIG. 9 is a second equivalent circuit diagram illustrating a method of measuring a resistance between the drains of the bidirectional switch.
Figure 10:
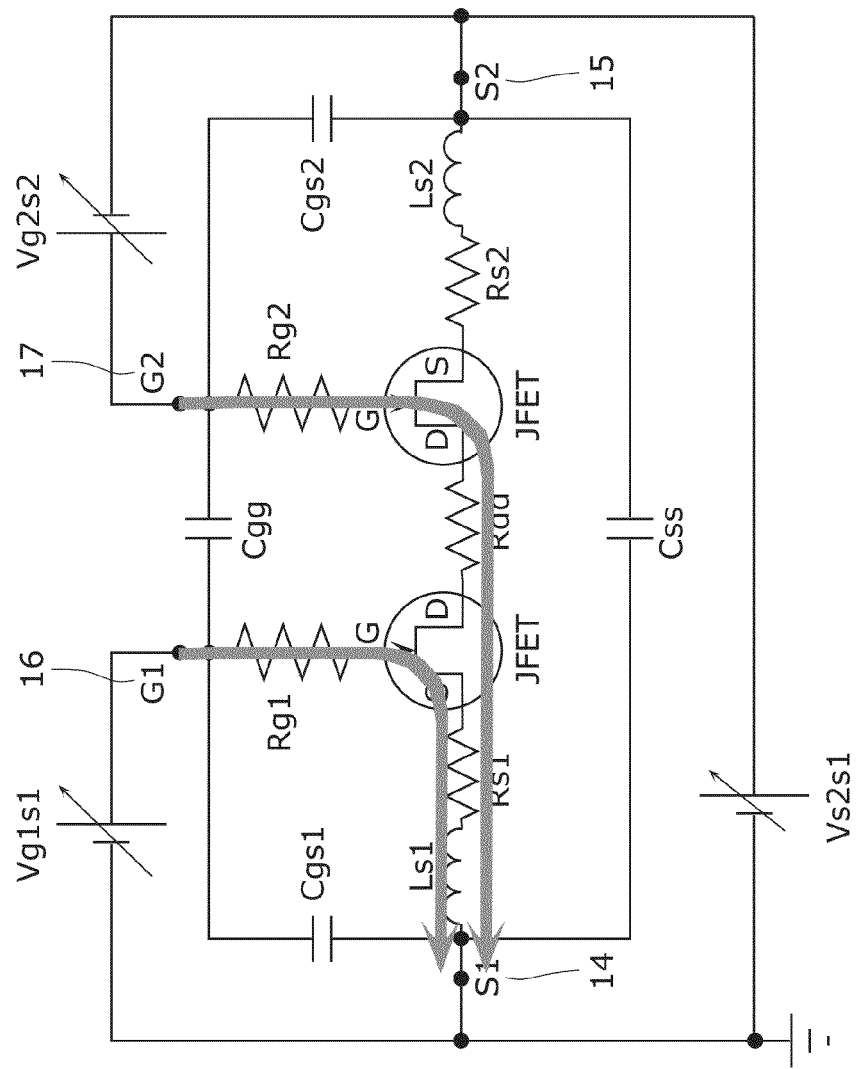
FIG. 10 is a third equivalent circuit diagram illustrating a method of measuring a resistance between the drains of the bidirectional switch.

FIG. 7 is a flowchart of a method for measuring a drain-to-drain resistance. FIGS. 8, 9, and 10 each illustrate a method of measuring a drain-to-drain resistance. It should be noted that a description below is given of, using FIGS. 8, 9, and 10, how to obtain a resistance value of the resistor 36 using an equivalent circuit diagram, to facilitate the understanding. However, actually, the following measurement is conducted for the bidirectional switch 100.

As described above, several resistance components are included between the first source electrode 14 and the second source electrode 15, and thus it is impossible to obtain only a drain-to-drain resistance by separating the resistance from current-voltage characteristics representing a relationship between a current and a voltage between the source electrodes.

Thus, first, one of the source electrodes, for example, the second source electrode 15 is made to be floating (the state in which the second source electrode 15 is not connected to anything) (S101 in FIG. 7).

Next, a voltage higher than the potential of the first source electrode 14 by a threshold voltage is applied to the first gate electrode 16, thereby bringing a channel directly therebelow into an open state. Specifically, a voltage higher than the potential of the first source electrode 14 by a predetermined potential difference or more is applied to the first gate electrode 16. As a result, most of the resistance of a portion of the bidirectional switch 100 corresponding to the JFET 351 in the equivalent circuit 1000 can be ignored.

In this state, a voltage between the second gate electrode 17 and the first source electrode 14 is changed, and current-voltage characteristics representing a relationship between a second gate current and a second gate voltage are measured (S102 in FIG. 7). The path through which a current flows in this case is a path indicated by the thick line in FIG. 8. Here, the second gate current means a current flowing from the second gate electrode 17 to the first source electrode 14, and the second gate voltage means a voltage at the second gate electrode 17 relative to the first source electrode 14.

The current path illustrated in FIG. 8 mentioned above includes resistance values of portions of the bidirectional switch 100 corresponding to the resistor Rs1, the resistor Rdd, and the resistor Rg2 in the equivalent circuit 1000. Specifically, assuming that the measured gate voltage is Vg2s1 and the gate current is Ig2s1, the sum of resistances of Rs1, Rdd, and Rg2 is obtained from Expression (1) below $$Rs1+Rdd+Rg2=Vg2s1/Ig2s1 \qquad \text{Expression (1)}$$

Next, the second gate electrode 17 is made to be floating, and the voltage between the first gate electrode 16 and the first source electrode 14 is changed, and then current-voltage characteristics representing a relationship between a first gate current and a first gate voltage are measured (S103 in FIG. 7). The path through which a current flows in this case is a path shown by the thick line in FIG. 9. Here, the first gate current means a current flowing from the first gate electrode 16 to the first source electrode 14, and the first gate voltage means a voltage at the first gate electrode 16 relative to the first source electrode 14.

The current path illustrated in FIG. 9 mentioned above includes resistance values of portions of the bidirectional switch 100 corresponding to the resistor Rs1, the resistor Rdd, and the resistor Rg1 in the equivalent circuit 1000. Specifically, assuming that the measured gate voltage is Vg1s1 and the gate current is Ig1s1, the sum of resistances of Rs1 and Rg1 is obtained from Expression (2) below.

$$Rs1+Rg1=Vg1s1/Ig1s1 \qquad \text{Expression (2)}$$

Here, the resistance of Rg1 between the first gate electrode and the channel and the resistance of Rg2 between the second gate electrode and the channel are the same. That is because in the bidirectional switch 100, basically two gate electrodes have the same geometric structure, and in addition, two protective films are produced so as to have the same geometric structure and the same doping concentration. Thus, the value of the drain-to-drain resistance (the resistance of the resistor 36) is obtained (S104 in FIG. 7) by subtracting the resistance value between the first gate electrode and the first source electrode shown by Expression (2) from the resistance value between the second gate electrode and the first source electrode shown by Expression (1), as shown by Expression (3) below. It should be noted that these resistance values are resistance values in the paths shown by thick lines in FIG. 10.

$$(Rs1+Rdd+Rg2)-(Rs1+Rg1)=Rdd \qquad \text{Expression (3)}$$

$$(\because Rg1=Rg2)$$

By using the above method, the resistance value of the drain-to-drain resistor Rdd is measured in the bidirectional switch 100, and the resistance value of the resistor 36 in the equivalent circuit 1000 is determined, thereby performing a simulation with higher precision. It is certainly possible to calculate other resistance values using Expressions (1) to (3), based on the measured value of Rdd. In addition, the values of capacitors of the equivalent circuit 1000 can be obtained by measuring capacitance values between the electrodes of the bidirectional switch 100.

It should be noted that a simulation device which uses the equivalent circuit 1000 may be achieved as hardware by providing constituent elements of the equivalent circuit 1000 on the substrate, and the equivalent circuit 1000 may be achieved as circuit information. Here, circuit information shows connection relation and circuit constants of constituent elements of the equivalent circuit 1000 and others using data.

FIG. 11 illustrates a netlist which is an example of circuit information.

The netlist shown in FIG. 11 represents an electric network used in the simulation program with integrated circuit emphasis (SPICE) which is general circuit simulation software. Thus, with such a netlist, electrical properties of the bidirectional switch formed as a single element can be calculated using SPICE.

It should be noted that circuit information is not limited to a netlist, and may be data obtained by recording the connection relation and circuit constants of the circuit elements of the equivalent circuit 1000 as described above.

A description is given of a simulation device for performing a simulation method using the equivalent circuit 1000 as described above, using FIG. 12.

Figure 12:
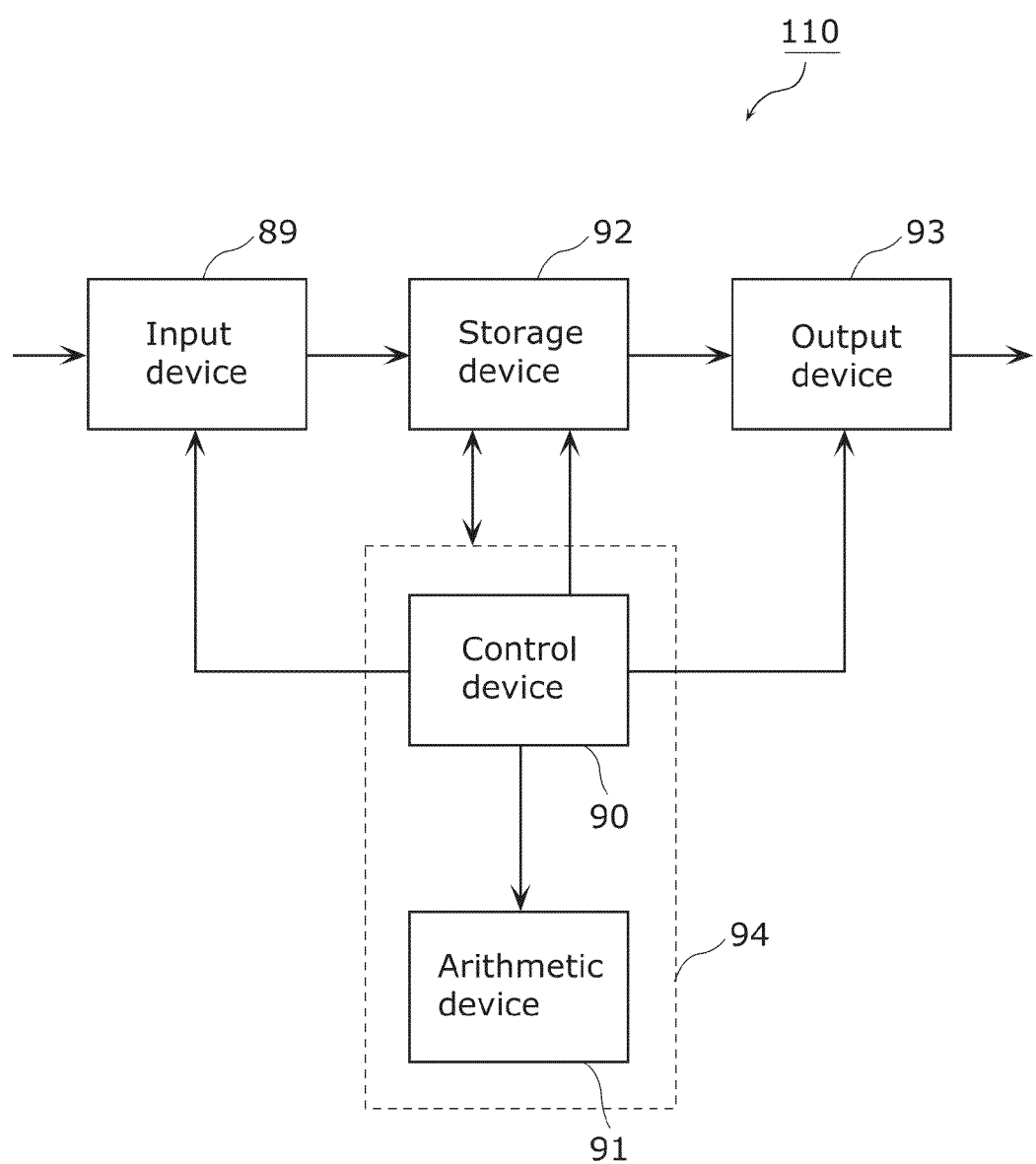
FIG. 12 is a block diagram illustrating a schematic structure of a simulation device.

FIG. 12 is a block diagram of a simulation device according to Embodiment 1.

As illustrated in FIG. 12, a simulation device 110 includes an input device 89 (input unit) which includes, for example, a keyboard and a data reading device of various types, a control device 90 such as a CPU which performs various control and computations, an arithmetic device 91 (calculation unit 94) such as an arithmetic-logic unit (ALU), a storage device 92 (storage unit) such as semiconductor memory or a hard disk, and an output device 93 such as a monitor or a printer. The simulation device 110 may be configured for exclusive use, or for example, may be achieved in association with a device such as a workstation or a personal computer. Circuit information of the equivalent circuit 1000 is stored in the storage device 92. The result of computation by the arithmetic device 91 is stored in the storage device 92.

Next is a description of the operation of the simulation device 110.

Figure 13:
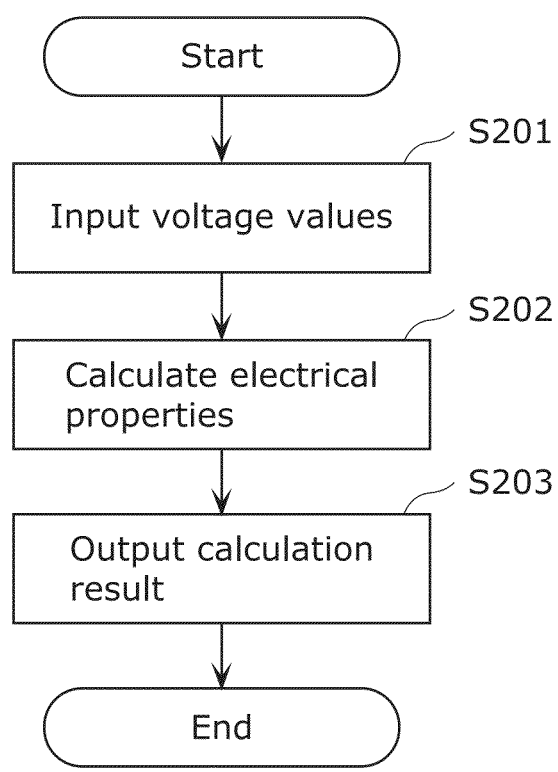
FIG. 13 is a flowchart of simulation operation using an equivalent circuit.

FIG. 13 is a flowchart of operation of the simulation device 110.

In the above configuration, voltage values (the minimum value, the maximum value, a step value, and the like) of electrodes are set and inputted first (S201 in FIG. 13). The voltage values of the electrodes inputted from the input device 89 are taken into and stored in the storage device 92 by the control of the control device 90.

The circuit information of the equivalent circuit 1000 stored in the storage device 92 is transferred to the arithmetic device 91 by the control of the control device 90, and the electrical properties of the bidirectional switch are derived (calculated) (S202 in FIG. 13). The properties are transferred to and stored in the storage device 92. Finally, the electrical properties of the bidirectional switch 100 stored in the storage device 92 are outputted to the output device 93 by the control of the control device 90 (S203 in FIG. 13).

Embodiment 2

In Embodiment 1, a description is given of an equivalent circuit in relation to a bidirectional switch which includes a group III nitride semiconductor, and a simulation device which uses the equivalent circuit. However, the configuration of the bidirectional switch and the configuration of the equivalent circuit are not limited to those according to Embodiment 1.

The following is a description of Embodiment 2 with reference to the accompanying drawings.

Figure 14:
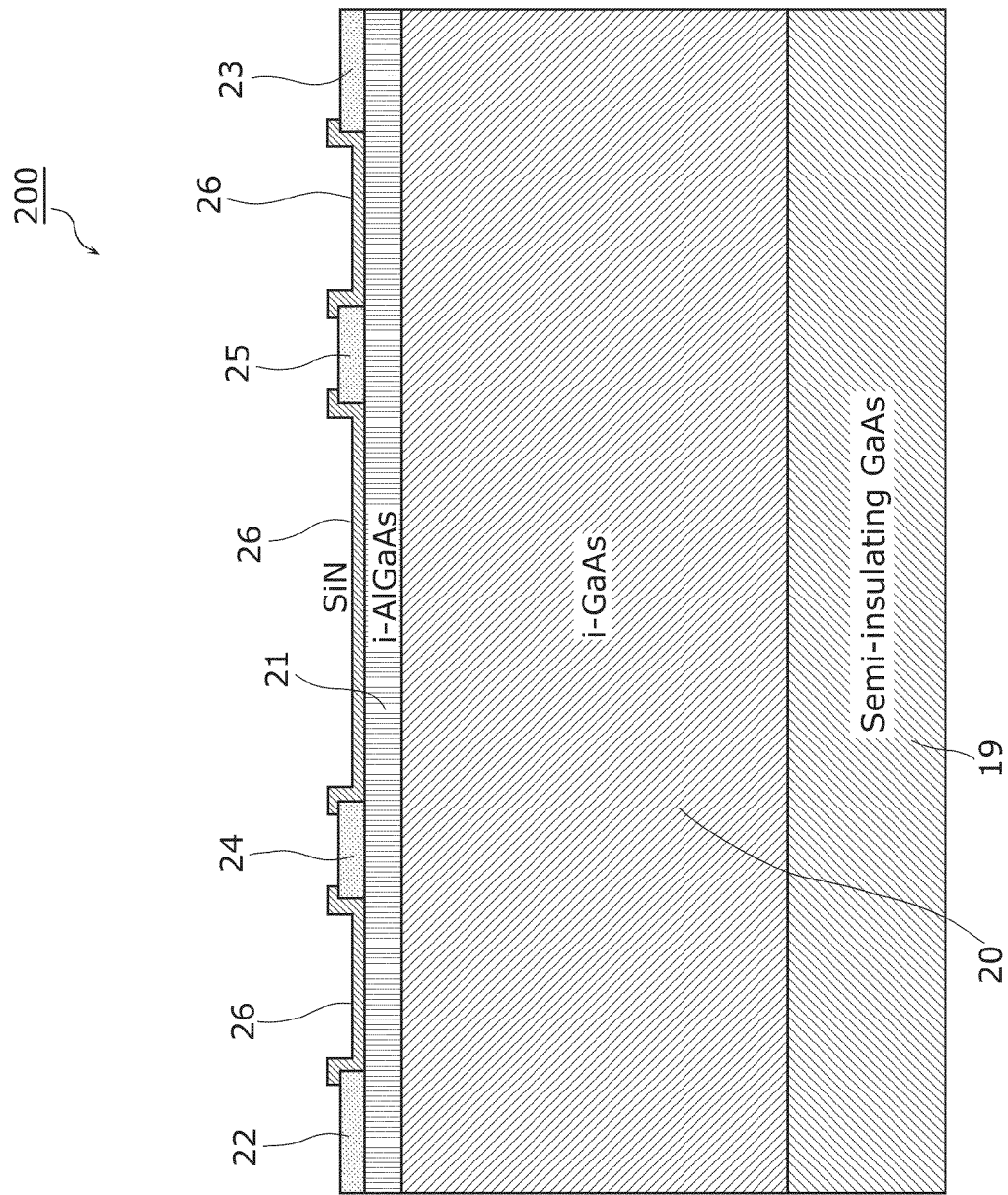
FIG. 14 illustrates an example of an element structure of a bidirectional switch according to Embodiment 2.

First, a description is given of, using FIG. 14, a bidirectional switch to which a simulation method according to Embodiment 2 is applied, the bidirectional switch being formed as a single element, having a double gate structure, and including a III-V or II-VI group compound semiconductor.

Specifically, a semiconductor device (bidirectional switch 200) illustrated in FIG. 14 includes: a first III-V or II-VI group compound semiconductor (i-GaAs) layer 20 formed on a semi-insulating GaAs substrate 19; a second III-V or II-VI group compound semiconductor (i-AlGaAs) layer 21 formed on the first III-V or II-VI group compound semiconductor (i-GaAs) layer 20, and having a greater band gap than the first semiconductor layer; a first gate electrode 24 and a second gate electrode 25 formed on the second III-V or II-VI group compound semiconductor (i-AlGaAs) layer 21 in a direction parallel to the main surface of the substrate, so as to be separate from each other; a first source electrode 22 formed on the second III-V or II-VI group compound semiconductor (i-AlGaAs) layer 21, in an area on a side of the first gate electrode, the area being opposite to the second gate electrode; and a second source electrode 23 formed on the second III-V or II-VI group compound semiconductor (i-AlGaAs) layer 21, in an area on a side of the second gate electrode 25, the area being opposite to the first gate electrode 24.

It should be noted that a protective film 26 is formed so as to cover the III-V or II-VI group compound semiconductor (i-AlGaAs) layer 21, except for portions corresponding to the electrodes.

This semiconductor device includes the first gate electrode 24 and the second gate electrode 25 formed in a horizontal direction, on the second III-V or II-VI group compound semiconductor (i-AlGaAs) layer 21 so as to be separate from each other, it is possible to control electrical conductivity between the two source electrodes by a bias applied to the first gate electrode 24 and the second gate electrode 25.

Accordingly, irrespective of the bias applied to the first gate electrode 24, when at least the potential of the second source electrode 23 is lower than the potential of the first source electrode 22, a potential lower than the potential of the second source electrode 23 is applied to the second gate electrode 25, thereby bringing a channel region below the second gate electrode 25 into a pinch-off state. As a result, a semiconductor device can be achieved which has excellent peak reverse voltage characteristics which conventional HFET including a III-V or II-VI group compound semiconductor does not have. The application of this device allows a bidirectional switch to be achieved which is formed as a single element and smaller in size than a conventional one.

Here, with regard to such a bidirectional switch 200, it is difficult to obtain a simulation result with high precision even if the equivalent circuit 1000 illustrated in FIG. 4 is used. In view of this, the inventors of the present application achieved the following equivalent circuit of the bidirectional switch 200, as a result of energetic research.

Figure 15:
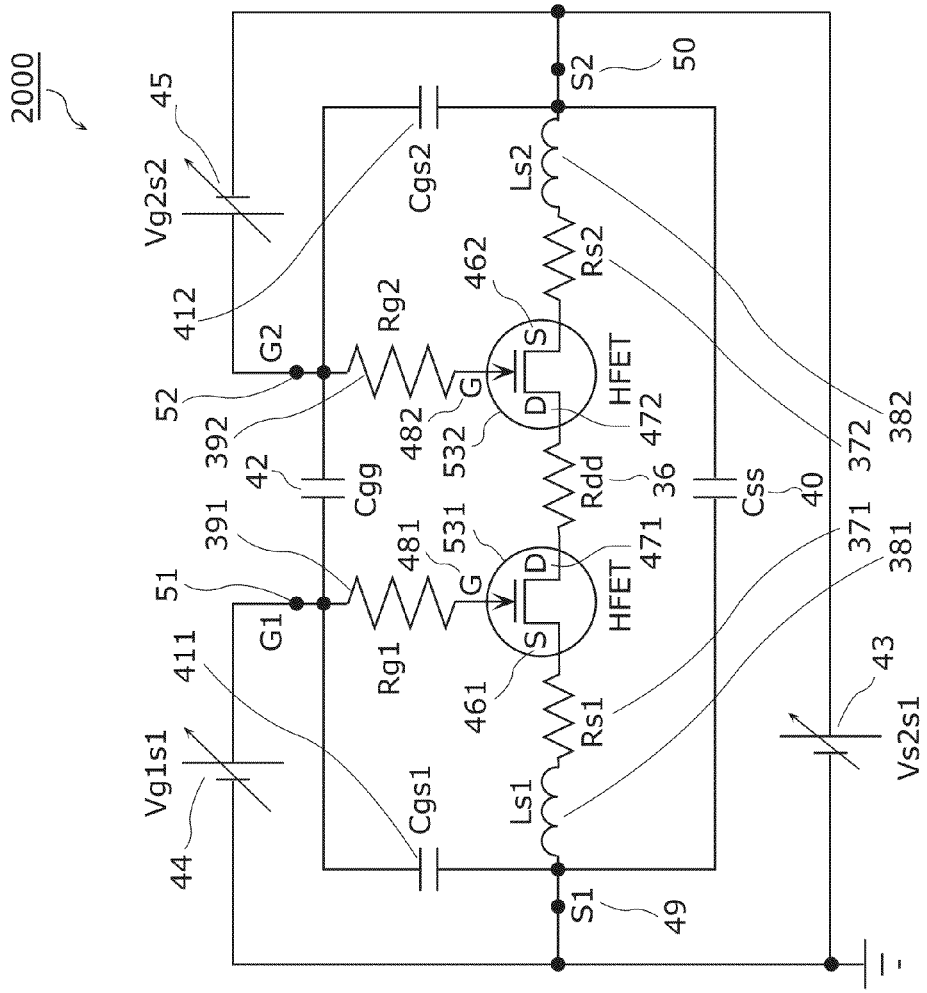
FIG. 15 is an equivalent circuit diagram of the bidirectional switch according to Embodiment 2.

FIG. 15 illustrates an equivalent circuit 2000 of the bidirectional switch 200 having a double gate structure and formed as a single element for which the III-V or II-VI group compound semiconductors are used in FIG. 14. The difference of the equivalent circuit 2000 from the equivalent circuit 1000 according to Embodiment 1 is the type of field effect transistors used for the circuit. Specifically, a feature is a symmetrical structure in which drain electrodes of two hetero-junction field effect transistors (HFET) are connected via a resistor.

The circuit arrangement of the equivalent circuit 2000 is a configuration in which the JFET 351 in the equivalent circuit 1000 in FIG. 4 is replaced with a HFET 531, and the JFET 352 is replaced with a HFET 532. Other portions have the same configuration as that of the equivalent circuit 1000 illustrated in FIG. 4, and thus a description thereof is omitted. In addition, the way to obtain the drain-to-drain resistance of the bidirectional switch is the same as that of Embodiment 1, and thus a description thereof is omitted.

The configuration of the simulation device according to Embodiment 2 using the equivalent circuit 2000 is the same as that described using FIG. 12. In this case, the equivalent circuit 2000 is achieved as a netlist as illustrated in FIG. 16, for example.

Embodiment 3

The configuration of a bidirectional switch and the configuration of an equivalent circuit may be those as described below.

The following is a description of Embodiment 3 with reference to the accompanying drawings.

Figure 17:
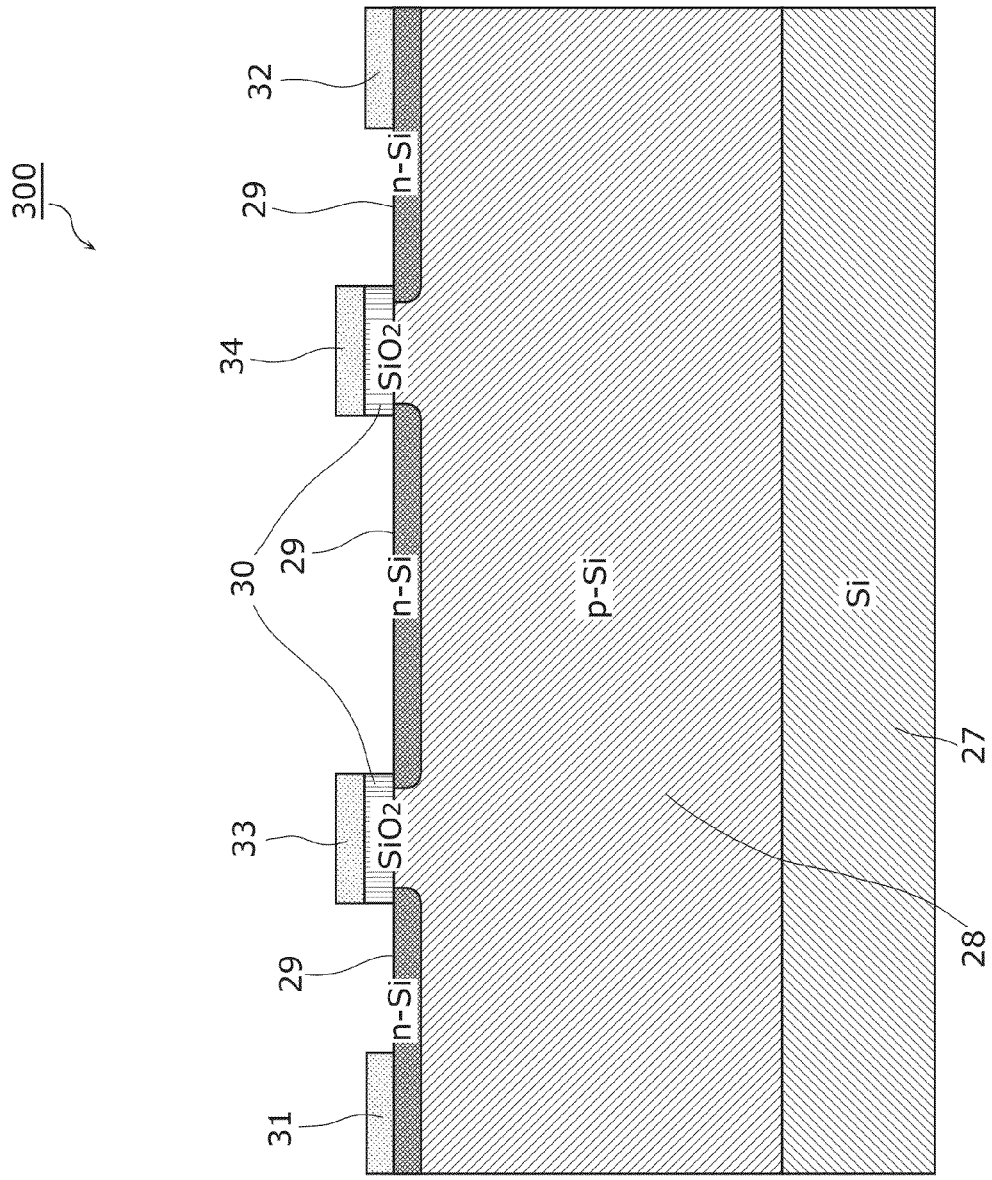
FIG. 17 illustrates an example of an element structure of a bidirectional switch according to Embodiment 3.

First, a description is given of, using FIG. 17, a bidirectional switch which is formed as a single element, has a double gate structure, and includes silicon or SiC, and to which a simulation method according to Embodiment 3 is applied.

Specifically, a semiconductor device (bidirectional switch 300) illustrated in FIG. 17 includes: a p-type silicon layer 28 formed on a Si substrate 27; an n-type silicon layer 29 and a $SiO_2$ layer 30 formed on the p-type silicon layer 28; a first gate electrode 33 and a second gate electrode 34 formed on the SiO2 layer 30 in a direction parallel to the main surface of the substrate, so as to be separate from each other; a first source electrode 31 formed on the n-type silicon layer 29, in an area on a side of the first gate electrode 33, the area being opposite to the second gate electrode 34; and a second source electrode 32 formed on the n-type silicon layer 29, in an area on a side of the second gate electrode 34, the area being opposite to the first gate electrode 33.

This semiconductor device includes the first gate electrode 33 and the second gate electrode 34 formed on the $SiO_2$ layer 30 in a horizontal direction so as to be separate from each other, and thus the electrical conductivity between the two source electrodes can be controlled by biases applied to the first gate electrode 33 and the second gate electrode 34. Accordingly, irrespective of the bias applied to the first gate electrode 33, when at least the potential of the second source electrode 32 is lower than the potential of the first source electrode 31, a potential lower than the potential of the second source electrode 32 is applied to the second gate electrode 34, thereby bringing a channel region below the second gate electrode 34 into a pinch-off state. As a result, a semiconductor device can be achieved which has excellent peak reverse voltage characteristics which a conventional MOSFET including silicon or SiC cannot have. The application of this device allows a bidirectional switch to be achieved which is formed as a single element and smaller in size than a conventional switch.

Here, it is difficult to obtain, for such a bidirectional switch 200, a simulation result with high precision, even if the equivalent circuit 1000 illustrated in FIG. 4 or the equivalent circuit 2000 illustrated in FIG. 15 is used. In view of this, the inventors of the present application achieved an equivalent circuit below for a bidirectional switch 300, as a result of energetic research.

Figure 18:
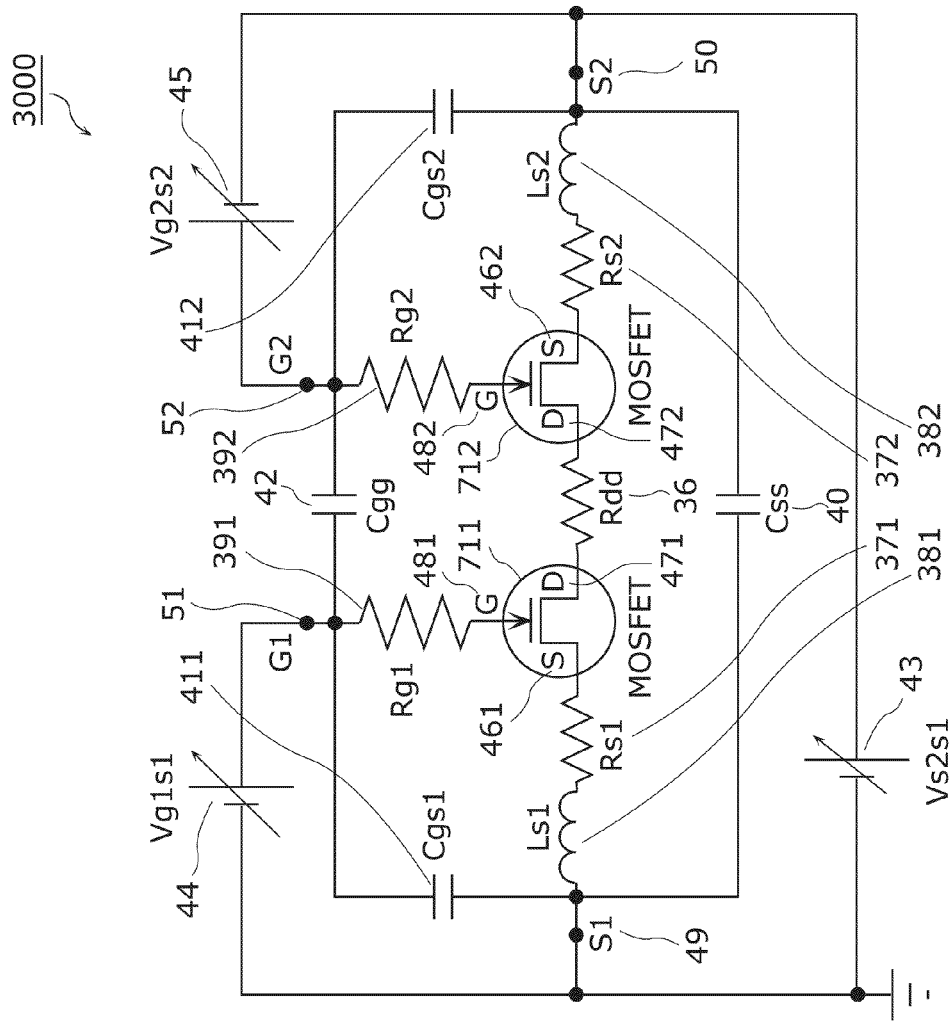
FIG. 18 is an equivalent circuit diagram of a bidirectional switch according to Embodiment 3.

FIG. 18 shows an equivalent circuit 3000 of a bidirectional switch having a double gate structure and formed as a single element in FIG. 17 for which silicon or SiC is used. The difference of the equivalent circuit 3000 from the equivalent circuit 1000 according to Embodiment 1 is the type of field effect transistors used for the circuit. Specifically, a feature is a symmetrical structure in which drain electrodes of two MOSFETs are connected via a resistor.

The circuit configuration of the equivalent circuit 3000 is a configuration in which the JFET 351 in the equivalent circuit 1000 in FIG. 4 is replaced with a MOSFET 711, and the JFET 352 is replaced with a MOSFET 712. Other portions have the same configuration as that of the equivalent circuit 1000 illustrated in FIG. 4, and thus a description thereof is omitted. In addition, the way to obtain the drain-to-drain resistance of the bidirectional switch is the same as that of Embodiment 1, and thus a description thereof is omitted.

The configuration of a simulation device according to Embodiment 3 which uses the equivalent circuit 3000 is the same as that described using FIG. 12. In this case, the equivalent circuit 3000 is achieved as a netlist as illustrated in FIG. 19, for example.

Although exemplary embodiments are described above, it is needless to say that the techniques disclosed herein are not limited to the above embodiments. The cases as below are also included in the scope of the appended Claims and their equivalents.

(1) Specifically, each device described above may be achieved by a computer system which includes a microprocessor, a ROM, a RAM, a hard disk unit, a display unit, a keyboard, a mouse, and the like. A computer program is stored in the RAM or the hard disk unit. The operation of the microprocessor in accordance with the computer program allows each device to achieve its functionality. Here, the computer program includes a combination of instruction codes indicating instructions to a computer in order to achieve given functionality.

(2) Some or all of constituent elements included in each device described above may include a single system large scale integration (LSI: large scale integrated circuit). The system LSI is a super multi-function LSI manufactured by integrating multiple components in one chip, and is specifically a computer system configured so as to include a microprocessor, a ROM, a RAM, and so on. A computer program is stored in the RAM. The system LSI accomplishes its functions through the load of the computer program from the ROM to the RAM by the microprocessor and the operation of the microprocessor in accordance with the computer program.

(3) Some or all of constituent elements included in each device described above may include an IC card or a single module which can be attached to or detached from the device. The IC card or the module is a computer system which includes a microprocessor, a ROM, a RAM, and the like. The above super-multifunctional LSI may be included in the IC card or the module. The IC card or the module accomplishes its functions through the operation of the microprocessor in accordance with the computer program. This IC card or module may have tamper resistant properties.

(4) The techniques disclosed herein may be achieved by the methods described above. In addition, these methods may be achieved by a computer program implemented by a computer, or may be implemented by a digital signal which includes a computer program.

The techniques disclosed herein may be achieved by a computer program or a digital signal stored in a computer-readable recording medium such as, for example, a flexible disk, a hard disk, CD-ROM, MO, DVD, DVD-ROM, DVD-RAM, a blue-ray disc (BD), or a semiconductor memory. Alternatively, the techniques disclosed herein may be achieved by a digital signal stored in such a recording medium.

With the techniques disclosed herein, the computer program or the digital signal may be transmitted via, for instance, data broadcasting or a network typified by electric telecommunication lines, wireless or wired communication lines, and the Internet.

The present disclosure may be a computer system which includes a microprocessor and a memory, the memory may have stored therein a computer program, and the microprocessor may operate in accordance with the computer program.

Another independent computer system may implement a program or a digital signal which has been stored in a recording medium and transported thereto or a program or a digital signal transported via a network or the like.

(5) The above embodiments and the above variation may be combined.

It should be noted that the techniques disclosed herein are not limited to these embodiments and variations. Various modifications to the embodiments that may be conceived by those skilled in the art and combinations of constituent elements in different embodiments and variations thereof may be included within the scope of the appended Claims and their equivalents, without departing from the spirit of the present disclosure.

The herein disclosed subject matter is to be considered descriptive and illustrative only, and the appended Claims are of a scope intended to cover and encompass not only the particular embodiments disclosed, but also equivalent structures, methods, and/or uses.

INDUSTRIAL APPLICABILITY

According to one or more exemplary embodiments disclosed herein, electrical properties of a bidirectional switch having a double gate structure and formed as a single element can be simulated with high precision. Thus, an equivalent circuit of a bidirectional switch and a simulation method according to one or more exemplary embodiments disclosed herein are useful to the design of a power electronic circuit which includes the bidirectional switch having a double gate structure and formed as a single element.

The invention claimed is:

1. An equivalent circuit of a bidirectional switch which is formed as a single element, includes: a first source electrode; a second source electrode; a first gate electrode; and a second gate electrode, and controls, using a voltage applied to the first gate electrode and the second gate electrode, a current flowing between the first source electrode and the second source electrode, the equivalent circuit comprising:

a first field effect transistor having a first gate, a first electrode, and a second electrode;

a first resistor and a first inductor connected in series, and having a terminal electrically connected to the first electrode and another terminal electrically connected to a first input/output electrode corresponding to the first source electrode;

a third resistor having a terminal electrically connected to the first gate and another terminal electrically connected to a first control electrode corresponding to the first gate electrode;

a first capacitor having a terminal electrically connected to the first input/output electrode and another terminal electrically connected to the first control electrode;

a second field effect transistor having a second gate, a third electrode, and a fourth electrode;

a second resistor and a second inductor connected in series, and having a terminal electrically connected to the third electrode and another terminal electrically connected to a second input/output electrode corresponding to the second source electrode;

a fourth resistor having a terminal electrically connected to the second gate and another terminal electrically connected to the second control electrode corresponding to the second gate electrode;

a second capacitor having a terminal electrically connected to the second input/output electrode and another terminal electrically connected to the second control electrode;

a third capacitor having a terminal electrically connected to the first control electrode and another terminal electrically connected to the second control electrode;

a fourth capacitor having a terminal electrically connected to the first input/output electrode and another terminal electrically connected to the second input/output electrode; and a fifth resistor having a terminal electrically connected to the second electrode and another terminal electrically connected to the fourth electrode.

2. The equivalent circuit according to claim 1, wherein the first field effect transistor and the second field effect transistor are junction field effect transistors.

3. The equivalent circuit according to claim 1, wherein the first field effect transistor and the second field effect transistor are hetero-junction field effect transistors.

4. The equivalent circuit according to claim 1, wherein the first field effect transistor and the second field effect transistor are metal-oxide-semiconductor field effect transistors.

5. A simulation method for a bidirectional switch performed using the equivalent circuit according to claim 1, the simulation method comprising:

accepting input of voltage values of voltages to be applied to the first control electrode, the second control electrode, the first input/output electrode, and the second input/output electrode; and calculating an electrical property of the bidirectional switch, based on the equivalent circuit and the voltage values.

6. The simulation method according to claim 5, wherein in the calculation, a current value of a current is calculated, the current flowing between the first input/output electrode and the second input/output electrode when the first control electrode and the first input/output electrode have short-circuited and a voltage is applied across the second control electrode and the second input/output electrode, and a current value of a current is calculated, the current flowing between the first input/output electrode and the second input/output electrode when the second control electrode and the second input/output electrode have short-circuited and a voltage is applied across the first control electrode and the first input/output electrode.

7. The simulation method according to claim 5, further comprising determining a circuit constant of a resistance value of the fifth resistor of the bidirectional switch, wherein in the determination, a first resistance value is calculated using a voltage and a current, the voltage being applied across the first gate electrode and the first source electrode and the current flowing between the first gate electrode and the first source electrode in a state where the first gate electrode and the second source electrode are open, a second resistance value is calculated using a voltage and a current, the voltage being applied across the second gate electrode and the first source electrode and the current flowing between the second gate electrode and the first source electrode in a state where the second gate electrode and the second source electrode are open, and a difference between the first resistance value and the second resistance value is determined to be the resistance value of the fifth resistor.

8. A simulation device for a bidirectional switch, the simulation device comprising:

a storage unit configured to store therein the equivalent circuit according to claim 1 as circuit information;

an input unit configured to accept input of voltage values of voltages to be applied to the first control electrode, the second control electrode, the first input/output electrode, and the second input/output electrode; and a calculation unit configured to calculate an electrical property of the bidirectional switch, based on the circuit information and the voltage values.

9. A non-transitory recording medium having stored therein the equivalent circuit according to claim 1 as circuit information.

* * * * *